United States Patent
Chen et al.

(10) Patent No.: US 7,384,799 B2
(45) Date of Patent: Jun. 10, 2008

(54) METHOD TO AVOID AMORPHOUS-SI DAMAGE DURING WET STRIPPING PROCESSES IN THE MANUFACTURE OF MEMS DEVICES

(75) Inventors: Fei-Yun Chen, Hinchu (TW); Ni-Hwi Kuan, Hsinchu (TW); Yuh-Hwa Chang, Shulin (TW); Yuan-Pang Lee, Tongxiao (TW); Yuan-Ko Hwang, Hualien (TW); Shuh-Shun Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 244 days.

(21) Appl. No.: 11/044,857

(22) Filed: Jan. 26, 2005

(65) Prior Publication Data

US 2006/0166509 A1     Jul. 27, 2006

(51) Int. Cl.
*H01L 21/00* (2006.01)
*H01L 21/311* (2006.01)
*H01L 21/302* (2006.01)

(52) U.S. Cl. .............. 438/3; 438/52; 438/29; 438/35; 438/699; 438/704; 438/725; 438/734; 438/750; 438/753; 438/754; 438/757

(58) Field of Classification Search .............. None
See application file for complete search history.

(56) References Cited

U.S. PATENT DOCUMENTS

| | | | |
|---|---|---|---|
| 5,306,671 A | 4/1994 | Ogawa et al. | |
| 5,652,671 A | 7/1997 | Knipe et al. | |
| 6,281,135 B1 | 8/2001 | Han et al. | |
| 6,307,169 B1 | 10/2001 | Sun et al. | |
| 6,370,306 B1* | 4/2002 | Sato et al. | 385/129 |
| 7,205,176 B2* | 4/2007 | Chen et al. | 438/72 |
| 2005/0130360 A1* | 6/2005 | Zhan et al. | 438/197 |
| 2005/0260784 A1* | 11/2005 | Chen et al. | 438/52 |
| 2006/0037933 A1* | 2/2006 | Wang et al. | 216/2 |
| 2006/0044519 A1* | 3/2006 | Huibers et al. | 353/30 |
| 2006/0166509 A1* | 7/2006 | Chen ey al. | 438/745 |
| 2006/0171628 A1* | 8/2006 | Naniwada | 385/18 |
| 2006/0231921 A1* | 10/2006 | Van Kampen et al. | 257/529 |

* cited by examiner

*Primary Examiner*—David E Graybill
(74) *Attorney, Agent, or Firm*—Duane Morris LLP

(57) ABSTRACT

A method for forming a MEMS device using an amorphous silicon layer as a release layer includes etching superjacent films and using the amorphous silicon layer as an etch stop layer. The amorphous silicon layer is resistant to attack during the post-etch solvent stripping operation due to the oxidation of exposed portions of the amorphous silicon layer by use of an oxygen plasma.

18 Claims, 4 Drawing Sheets

METHOD TO AVOID AMORPHOUS-SI DAMAGE DURING WET STRIPPING PROCESSES IN THE MANUFACTURE OF MEMS DEVICES

FIELD OF THE INVENTION

The present invention relates, most generally, to structures and methods for forming semiconductor devices. More particularly, the present invention is related to forming microelectromechanical (MEMS) mirror structures by utilizing a releasable protect layer that is resistant to attack and thus insures the integrity of the mirror structure being formed.

BACKGROUND

MEMS (microelectromechanical system) are flexible cantilever-type structures that have many applications and an even greater potential in today's advancing technologies. MEMS are formed using semiconductor processing technology and are formed over substrates that may be formed of semiconductive or insulating materials. For example, MEMS may be deflectable mirror structures that can reflect light in different directions. In recent years, the projection-display industry has undergone a period of explosive growth. Until several years ago, such projection display systems were predominantly based on either cathode ray tubes (CRT) or active-matrix liquid crystal display (LCD) technology. All of these traditional display systems, however, suffer from limitations that compromise their performance or the spectrum of their applicability. LCD- and CRT-based systems are limited in their ability to support high-brightness applications, and they suffer from uniformity and stability problems in large-scale applications.

An emerging projection display technology called Digital Light Processing (DLP) accepts digital video and transmits to the eye a burst of digital light pulses that the eye interprets as a color analog image. Digital Light Processing is based on a MEMS device known as the digital micro mirror device (DMD) invented in 1987 at Texas Instruments Inc. The DMD is a fast, reflective digital light switch that combines with image processing, memory, and a light source and optics to form a digital light processing system. The DMD is a light switch that uses a plurality of electrostatically controlled MEMS mirror structures to digitally modulate light, producing high-quality imagery on-screen.

The MEMS used to form the plurality of light switches are typically formed over CMOS memory devices and using CMOS-like process. Each light switch includes a deflectable aluminum alloy mirror that can reflect light in different directions depending on the state of the underlying memory cell. The deflectable mirror of the MEMS, commonly an aluminum alloy, is formed over a releasable layer also referred to as a sustain layer. The sustain layer is formed between the mirror film and the substrate and is removed after the mirror layer has been formed into one or a plurality of discreet mirror structures that are anchored to the substrate to form cantilever-type MEMS. Several patterning and etching operations are used to pattern the mirror and other films formed over the sustain layer and the etching operations are typically plasma etching operations that etch down to the sustain layer which functions as an etch-stop layer. A preferred, easily removable sustain layer material is amorphous silicon, commonly represented as α-Si. The α-Si used as the sustain layer, however, is prone to attack during the wet photoresist strip/clean processes carried out at high temperatures such as are used in conjunction with the etching operations referred to above. If the α-Si sustain layer is attacked, the structural integrity of the MEMS may be compromised.

It would therefore be desirable to provide a method and structure for producing a MEMS mirror structure using an α-Si sustain layer that is not susceptible to attack.

SUMMARY OF THE INVENTION

To achieve these and other objects, and in view of its purposes, the present invention addresses the shortcomings of conventional technology and provides a method for forming a MEMS structure. An aspect of the invention is a method for forming a semiconductor device comprising forming an α-Si layer and forming at least one further material layer over the α-Si layer. The method further comprises patterning the further material layer or layers using a masking medium and etching the further material layer or layers using an etch process in which the α-Si layer serves as the etch stop layer. The method further comprises treating with an oxygen plasma therefore forming an oxide on exposed surfaces of the α-Si, then performing a solvent cleaning operation using a solvent that is capable of removing the masking medium and which includes an amine.

In another aspect, provided is a method for stripping photoresist from a semiconductor device. The method includes performing a dry photoresist stripping operation upon a substrate that includes at least exposed portions of α-Si layer, treating the exposed portions with an oxygen plasma and performing a solvent cleaning operation using a solvent that includes an amine.

In another aspect, provided is a method for forming a semiconductor device. The method comprises providing an α-Si layer, forming at least one further material layer over the α-Si layer, forming a pattern over the at least one further material layer using an organic masking medium, etching the at least one further material layer and stopping at the α-Si layer, treating with an oxygen plasma therefore oxidizing exposed portions of the α-Si layer, and performing a solvent cleaning operation with a solvent capable of removing the organic masking material.

In another aspect, provided is a method for stripping photoresist. The method includes providing a layer of α-Si, patterning using a photoresist masking material and etching the α-Si layer. A dry stripping procedure is then carried to strip the photoresist masking material using a first plasma. An oxygen plasma is used to treat the layer of α-Si and after dry stripping and treating, a solvent cleaning operation is carried out using a solution that includes an amine.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

An aspect of the invention is a method for forming a semiconductor device, more particularly, a method for removing a photoresist material from over an amorphous silicon layer using a wet stripping and cleaning operation that effectively removes the photoresist material without attacking the amorphous silicon layer. Amorphous silicon layers are often used as the release/sustain layer in the formation of MEMS devices and the method therefore finds particular application in methods used to form MEMS devices such as MEMS mirror structures. The invention is not limited to that application, however. In an exemplary embodiment, the method of the present invention may be used in conjunction with a solvent that includes an amine or other component that is capable of effectively removing photoresist or other organics and which, in the prior art, can attack the amorphous silicon layer. In one embodiment, the solvent may include MEA, monoethanolamine, and DMSO, dimethyl sulfoxide, as significant components but the invention is not intended to be limited to use in conjunction with any particular photoresist solvent stripper. The method of the invention also finds particular advantage when used in conjunction with a wet strip/clean operation that follows a dry plasma stripping operation. The invention is not intended to be limited to such particular application, however. A protective treatment of the amorphous silicon material is provided prior to the introduction of the wet stripping/cleaning solvent to prevent damage of the amorphous silicon layer during the wet stripping/cleaning operation. The amorphous silicon layer is particularly susceptible to attack since it may serve as the etch-stop layer for a multitude of etching operations used in the formation of MEMS devices, and is therefore exposed to multiple photoresist stripping and cleaning operations.

Figure 1:
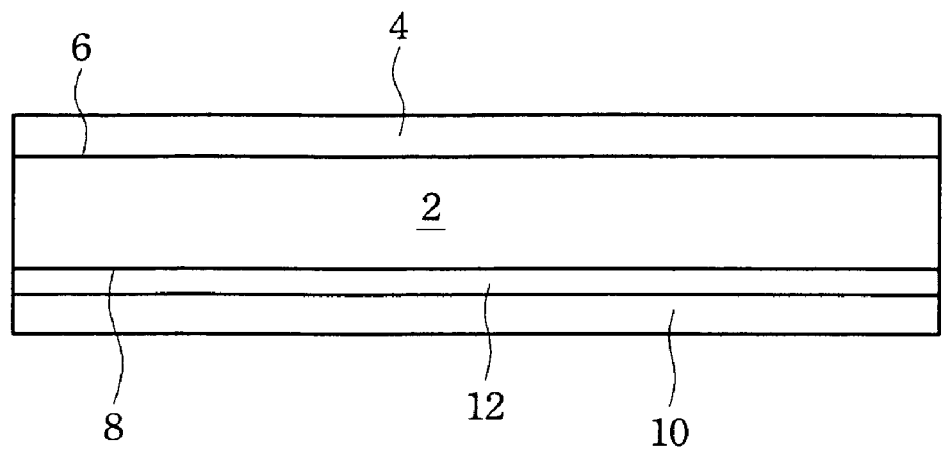
FIGS. 1-6 show an exemplary sequence of processing operations used to form an exemplary MEMS structure.

The sequence of processing operations illustrated in the figures is intended to be exemplary only. FIG. 1 shows exemplary substrate 2 which may be a semiconductor or insulating substrate upon which semiconductor devices of various technologies are formed. Amorphous silicon, α-Si layer 4 is formed over top surface 6 of substrate 2. Although α-Si layer 4 is illustrated as being formed on top surface 6, additional layers may be interposed between α-Si layer 4 and substrate 2 in other exemplary embodiments. In an exemplary embodiment such as used to form MEMS structures, TiN layer 12 is formed on bottom surface 8 of substrate 2 and lower α-Si layer 10 is formed on TiN layer 12 in the illustrated embodiment. This is intended to be exemplary only and in other exemplary embodiments, bottom surface 8 of substrate 2 may have different materials formed thereon.

An aspect of the present invention is a method in which an α-Si layer is treated with an oxygen plasma prior to exposure to a photoresist solvent stripper and the method may therefore be used in conjunction with various etching operations in which at least a portion of an α-Si layer is exposed. For example, the method may be used subsequent to an etching process used to etch amorphous silicon or it may be used subsequent to an etching process in which amorphous silicon serves as the etch stop layer. The method may be used in conjunction with photoresist removal after a dry, plasma etching operation. Various dry, plasma etching operations designed or capable of removing the photoresist material, may be used. After the dry, plasma operation such as one used to etch amorphous silicon or which uses amorphous silicon as an etch-stop layer, the photoresist is stripped. Various commercially available organic and other photoresist masking materials may be used. Positive or negative photoresist may be used. The photoresist masking material may be removed using one or more photoresist stripping processes. In one exemplary embodiment, a dry stripping operation, commonly referred to as ashing, may be used and followed by a wet processing operation which uses a solvent designed to remove any residual photoresist and clean the surfaces. The present invention provides an oxygen plasma treatment prior to the wet stripping/cleaning operation. The oxygen plasma may include an oxygen flow ranging from 200-700 sccm, a temperature within the range of 150° C. to 180° C., a power of 1000-1800 watts, and a pressure within the range of 600 to 1000 millitorr. Various conventional and suitable tools are available and may be used to carry out the oxygen plasma treatment. In an exemplary embodiment, the oxygen treatment may take place for 50 seconds but in other exemplary embodiments, the oxygen treatment may take place for a time ranging from 30 seconds to 5 minutes. In an exemplary embodiment, the oxygen plasma treatment may be carried out subsequent to, and in the same tool, as the dry, plasma stripping operation. In one exemplary embodiment, the two operations may be carried out in-situ. The oxygen plasma operation oxidizes exposed portions of the α-Si film and renders the α-Si film resistant to attack during subsequent exposure to aggressive solvents which might otherwise attack the α-Si, if untreated. Portions of the α-Si film may become exposed during the etching operation or during the dry, plasma stripping operation. The aggressive solvents used to remove residual photoresist and clean the surfaces, may be used at high temperatures, such as within the range of 80° C.-115° C. The solvent, in one exemplary embodiment may include MEA (monoethanolamine) at 70% by volume and DMSO (dimethylsulfoxide) at 25% by volume. In one exemplary embodiment, this solvent may be ACT® 690C Etch Residue Remover And Positive Photoresist Stripper manufactured by ACT Electronic Chemicals of Allentown, Pa. ACT® 690C is an organic solvent blend which is particularly effective in removing severely processed photoresist films and etch residue over corrosion sensitive metals and alloys. ACT® 690C is a light amber liquid with a specific gravity of about 1.049 kg/l at 20° C., a boiling point of about 170° C., a freezing point of less than −15° C., a flashpoint of about 100° C., a viscosity of 12.6 cSt at 25° C. and a pH (5% solution) of about 11. In other exemplary embodiments, other solvent strippers that include at least one of MEA or DMSO may be used. In yet another exemplary embodiment, other amine-based solvent strippers capable of removing residual organic photoresist material, may be used. The oxidized α-Si surface will be resistant to attack by various commercially available photoresist stripper solvents. In another exemplary embodiment, EKC270, manufactured by EKC Technology, Inc. of Danville, Calif. may be used as the solvent stripper.

The solvent stripping operation may take place at the elevated temperatures referenced above and in one exemplary embodiment, the solvent stripping operation may be a sequence of two operations that take place in a set of wet baths in which the solution in the first bath is the stripping or "dirty" bath and the second bath is the clean bath. In an exemplary embodiment, the first bath may be at elevated temperature and the second bath may be at room temperature. The processing times in the two baths may be 12 minutes plus 12 minutes, 25 minutes plus 25 minutes or other times may be used. Other wet processing conditions, times and sequences may be used in other exemplary embodiments, however.

The following figures illustrate various etching processes that may be used in the formation of an MEMS structure and which may benefit from the use of the photoresist strip/treatment operation of the present invention.

Figure 2:
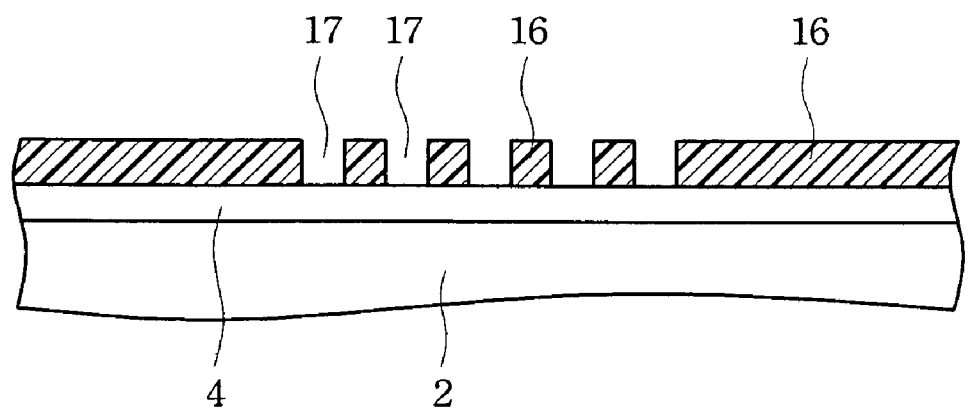

FIG. 2 shows patterned photoresist film 16 formed over α-Si layer 4. Patterned photoresist film 16 may be used to form the Zero pattern that may be useful in etching α-Si layer 4 to form alignment features. The portions of α-Si layer 4 that are exposed beneath openings 17 in patterned photoresist film 16 will be etched exposing sidewalls of the unetched α-Si layer 4 that are susceptible to attack if not for the disclosed method of the invention.

Figure 3:
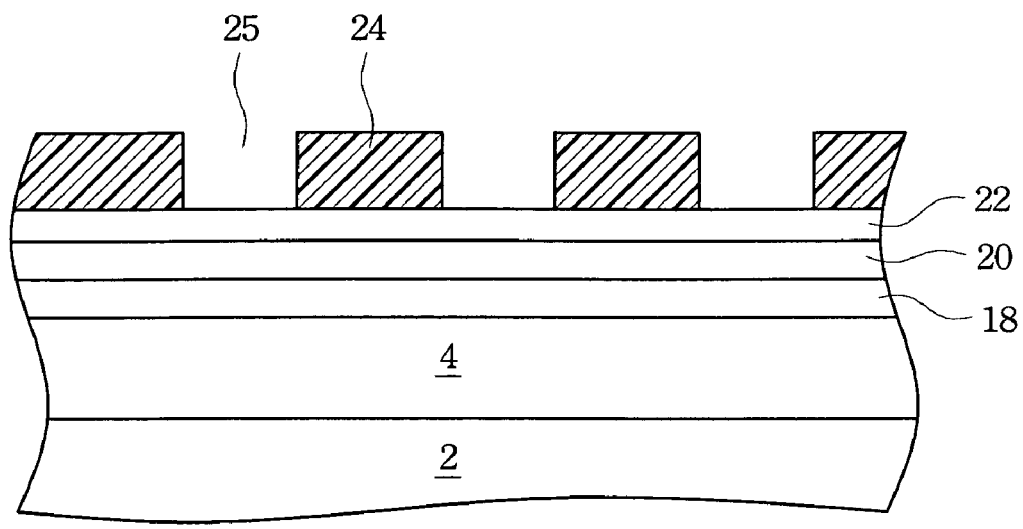

FIG. 3 shows patterned photoresist film 24 formed over a plurality of films including lower film 18, intermediate film 20, and upper film 22. In other exemplary embodiments, instead of a plurality of films, there may be only one film. For example, patterned photoresist film 24 may be formed over a single dielectric layer used in forming a via pattern. According to that exemplary embodiment, openings 25 of patterned photoresist film 24 are used to etch through the dielectric and form via openings therethrough. According to the illustrated embodiment, lower film 18 may be a silicon nitride film, intermediate layer 20 may be the mirror layer and upper layer 22 may be another silicon nitride layer. Either or both of the silicon nitride layers may have a thickness of about 900 angstroms in one exemplary embodiment but other thicknesses and other materials may be used in other exemplary embodiments. More or less than the three illustrated films may be used. Mirror layer 20 may be aluminum copper in one exemplary embodiment and it may be aluminum copper silicon in another exemplary embodiment. Other materials may be used as mirror layer 20 in other exemplary embodiments. Mirror layer 20 is a reflective layer and may include a thickness that ranges from 2500-10000 angstroms in an exemplary embodiment. The structure shown in FIG. 3 is then etched using a plasma etching operation or a sequence of different plasma etching operations to form the structure shown in FIG. 4. Anisotropic etching conditions may be used in an exemplary embodiment.

Figure 4:
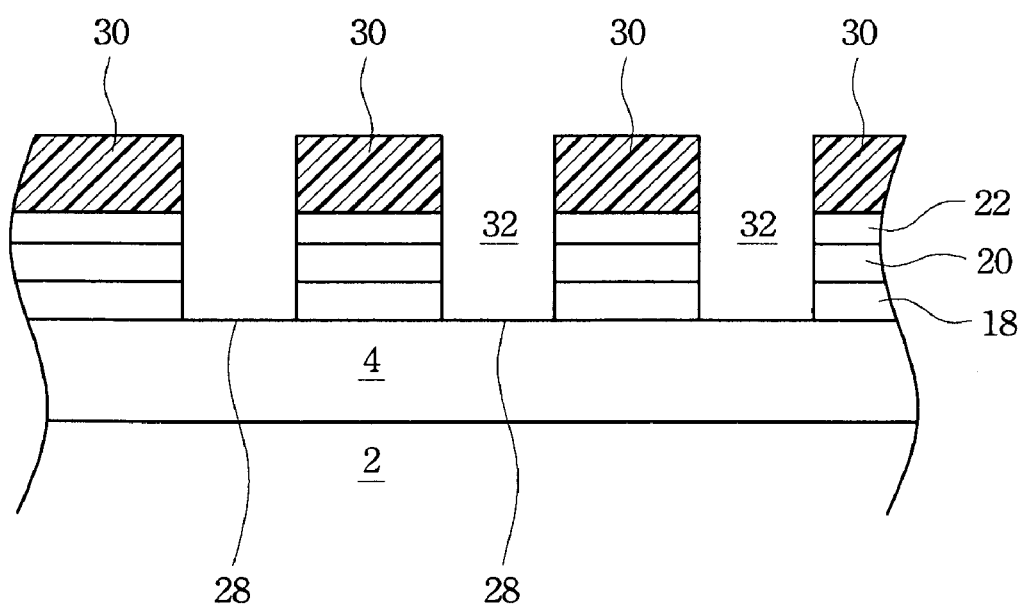

FIG. 4 shows a plurality of openings 32 formed through first layer 18, intermediate layer 20 and upper layer 22 and exposing surface 28 of α-Si layer 4 which serves as the etch stop layer. Openings 32 formed through the films, correspond to openings 25 of patterned photoresist film 24 shown in FIG. 3. Various plasma etching operations may be used to produce openings 32 and structures 30. After the plasma etching operation(s) have been concluded and with surfaces 28 of α-Si layer 4 exposed, discrete sections of photoresist 30 are then removed to form the structure shown in FIG. 5. The photoresist removal operations including the oxygen treatment of the α-Si layer 4, are as described above.

Figure 5:
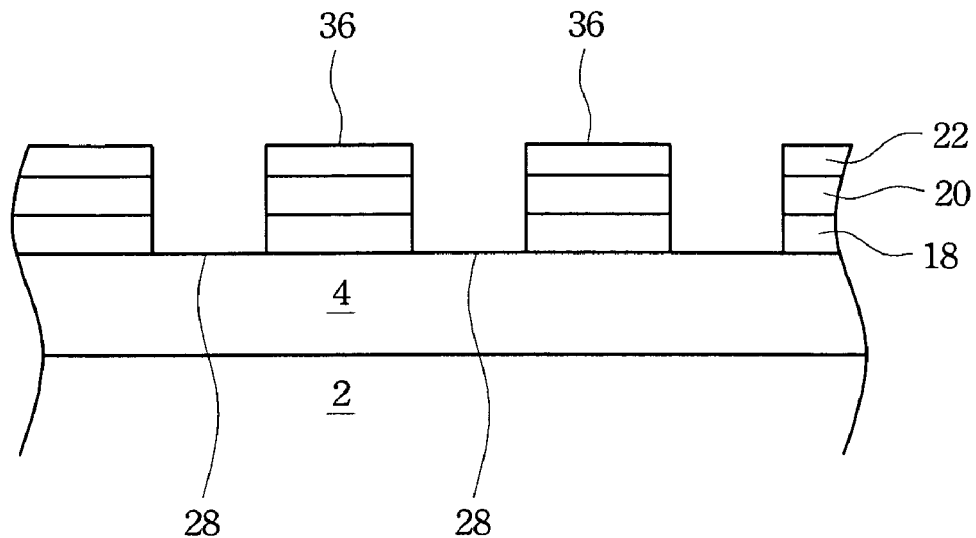
Figure 6:
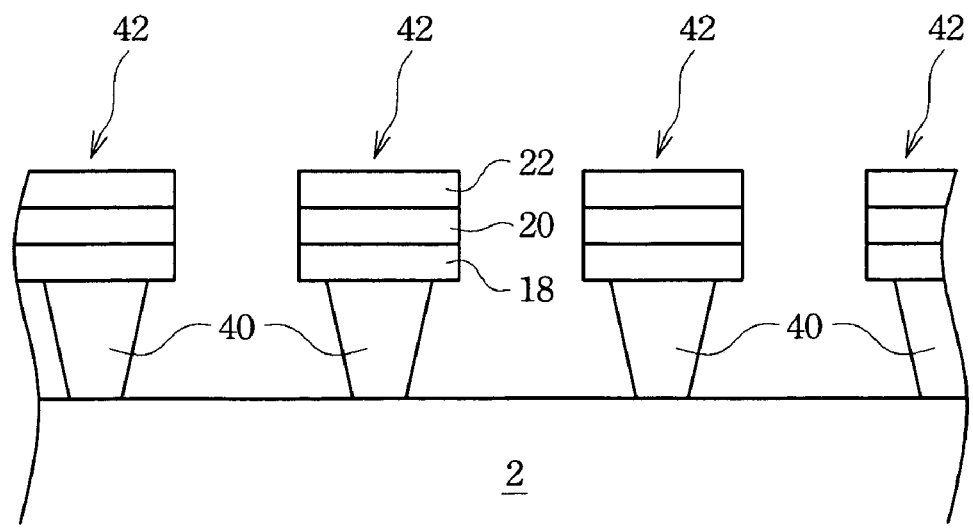
Figure 7:
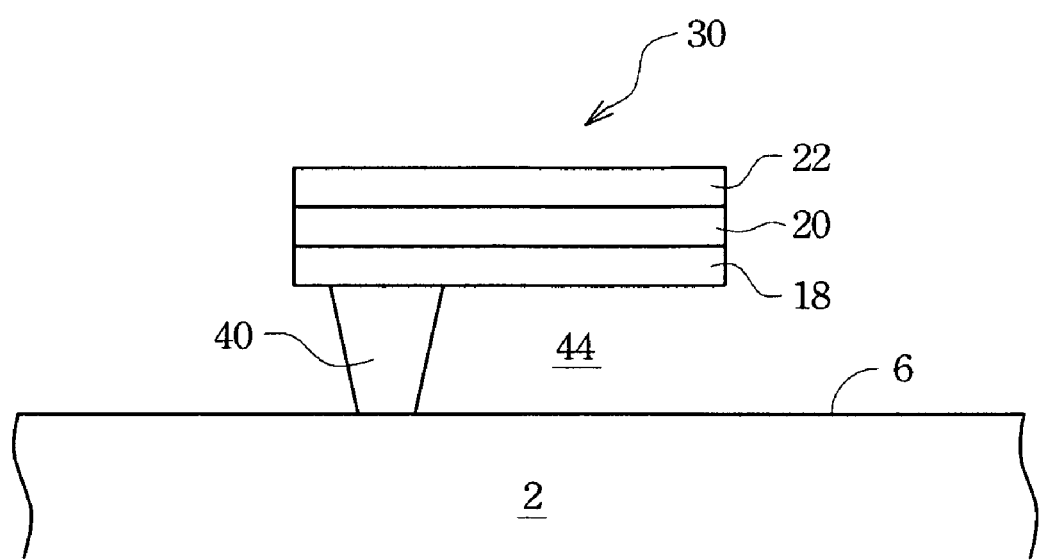
FIG. 7 is a side view of an MEMS structure shown in front view in FIG. 6.

FIG. 5 shows film stacks 36 that extend above α-Si layer 4 and exposed surfaces 28 of α-Si layer 4 which are not attacked during the photoresist stripping operation. In an exemplary embodiment, an MEMS structure may be formed from each film stack 36. According to this exemplary embodiment, α-Si layer 4, in addition to acting as an etch-stop layer in the etching operations used to form openings 32, serves as the sustain or release layer and is removed to form the structure shown in FIG. 6. α-Si layer 4 may be removed using conventional selective etch processes. In one exemplary embodiment, a first wet etching operation may be carried out to selectively remove the oxidized portion of α-Si layer 4 layer. An SiO film may be formed on surface 28 of α-Si layer 4 as a result of the treatment process of the present invention. After the oxidized portions are removed, the bulk of α-Si layer 4 may be removed using conventional selective etching means. After the α-Si release layer is removed, microcantilevers 42 are produced. Microcantilevers 42 each advantageously include a mirror layer which may be intermediate layer 20. Microcantilevers 42 are anchored to substrate 2 by way of anchors 40 which lie behind the plane of the illustration of FIG. 6, which represents a front view. FIG. 7 shows a side view of microcantilever 42 including anchor 40. Void area 44 lies beneath microcantilever 30 and layers 18, 20 and 22. In essence microcantilever 42, includes a portion suspended over an essentially parallel to substrate 2, particularly surface 6 of substrate 2.

In another embodiment, after at least one material layer is etched using the α-Si layer as an etch stop layer, and the photoresist removed and the α-Si layer treated as above, an additional layer or layer may be formed over the structure and, then etched using the α-Si layer as an etch stop layer. The photoresist mask is then removed utilizing the above-described process sequence including α-Si layer oxidation.

The microcantilever structures may be MEMS devices that find application as digital micro-mirror devices (DMDs). The DMD's are fast, reflective digital light switches that each have a mirror layer that can reflect light and may be used in many applications.

The preceding sequence of processing operations including the etching operations used to form the microcantilever structures, is exemplary only. Another exemplary process sequence in which the oxygen treatment of the present invention may be used as part of the photoresist stripping/cleaning operation including the oxygen plasma treatment that follows etching operations that expose α-Si, is as follows. Front side α-Si deposition is followed by backside α-Si deposition, then a front side α-Si etch is carried out. After the etch and photoresist stripping/cleaning operation including the oxygen plasma treatment, a thick α-Si layer deposition takes place and a Zero pattern is formed and etched. After the photoresist stripping/cleaning operation following the Zero etch operation, vias are patterned and etched. After the photoresist stripping/cleaning operation that follows the via etch, a thick silicon nitride film is deposited. The thick silicon nitride film is patterned and etched and the photoresist removed using the photoresist stripping/cleaning operation including the oxygen plasma treatment. Next, a mirror film such as aluminum copper and a further silicon nitride film are formed, then patterned. An etching operation is used to etch through both the further silicon nitride film and the mirror layer and the photoresist removed using the photoresist stripping/cleaning operation. A photoresist coating is then formed on the front side of the substrate and a backside etch is carried out. The backside etch process is followed by the photoresist stripping/cleaning operation The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
    providing an α-Si layer;
    forming at least one further material layer over said α-Si layer;
    forming a pattern over said at least one further material layer using a masking medium;
    etching said at least one further material layer and stopping at said α-Si layer;
    treating with an oxygen plasma therefore oxidizing exposed portions of said α-Si layer; and
    performing a solvent cleaning operation using a solvent that is capable of removing said masking medium and which includes an amine.

2. The method as in claim 1, wherein said masking medium comprises photoresist.

3. The method as in claim 1, wherein said solvent attacks un-oxidized α-Si.

4. The method as in claim 1, wherein said at least one further material layer comprises a plurality of further material layers, said etching said at least one further material layer comprises initially etching a single first layer of said at least one further material layer and stopping at another of said plurality of further material layers, then further etching at least a second layer of said plurality of layers using an etching operation that stops at said α-Si layer.

5. The method as in claim 4, wherein said forming at least one further material layer comprises forming a first silicon nitride layer, forming an aluminum copper layer and forming a second silicon nitride layer, said single first layer comprising said first silicon nitride layer.

6. The method as in claim 1, wherein said at least one further material layer comprises a first silicon nitride layer, an aluminum copper layer over said first silicon nitride layer and a second silicon nitride layer over said aluminum copper layer.

7. The method as in claim 1, wherein said forming at least one further material layer comprises forming a dielectric layer and said etching comprises etching openings through said dielectric layer and exposing portions of said α-Si layer.

8. The method as in claim 1, further comprising, after said performing, removing said α-Si layer including from beneath said at least one further material layer.

9. The method as in claim 8, wherein said α-Si layer is formed over a substrate and said removing said α-Si layer produces a plurality of hinges of said at least one further material layer anchored to said substrate, each hinge including a portion suspended over and essentially parallel to, said substrate.

10. The method as in claim 9, wherein said at least one further material layer includes a mirror layer and said hinges comprise MEMS.

11. The method as in claim 9, wherein said at least one further material layer includes an aluminum copper layer.

12. The method as in claim 1, further comprising exposing said masking material to a plasma capable of stripping said masking material, prior to said performing, wherein said exposing and said treating take place in-situ.

13. The method as in claim 1, wherein said treating includes a temperature within the range of 150-180° C., an oxygen flow in the range of 250-750 sccm, a pressure within the range of 600 to 1000 millitorr and a power within the range of 1000 to 1800 watts.

14. The method as in claim 1, in which said providing an α-Si layer comprises forming said α-Si layer on a surface of a substrate and further comprising forming a further α-Si layer over a titanium nitride layer formed on an opposed surface of said substrate, and in which said treating further oxidizes said further α-Si layer.

15. The method as in claim 1, wherein said performing takes place at a temperature of at least 150° C. and said α-Si layer is not attacked during said performing.

16. The method as in claim 1, wherein said solvent comprises ACT 690.

17. The method as in claim 1, wherein said solvent includes MEA and DMSO.

18. A method for forming a semiconductor device comprising:
    providing an α-Si layer;
    forming at least one further material layer over said α-Si layer;
    forming a pattern over said at least one further material layer using an organic masking medium;
    etching said at least one further material layer and stopping at said α-Si layer;
    treating with an oxygen plasma therefore oxidizing exposed portions of said α-Si layer; and
    performing a solvent cleaning operation with a solvent capable or removing said organic masking material.

* * * * *